United States Patent [19]
Chui et al.

[11] Patent Number: 6,025,208
[45] Date of Patent: Feb. 15, 2000

[54] METHOD OF MAKING ELECTRICAL ELEMENTS ON THE SIDEWALLS OF MICROMECHANICAL STRUCTURES

[75] Inventors: Benjamin W. Chui, Sunnyvale; Thomas W. Kenny, San Carlos, both of Calif.

[73] Assignee: The Board of Trustees of the Leland Stanford Junior University, Palo Alto, Calif.

[21] Appl. No.: 08/921,647

[22] Filed: Aug. 27, 1997

[51] Int. Cl.[7] .......................... H01L 21/00; H01L 21/425; H01L 21/22; H01L 21/38
[52] U.S. Cl. .............................. 438/50; 438/525; 438/565
[58] Field of Search ................................. 438/50, 52, 525, 438/565

[56] References Cited

U.S. PATENT DOCUMENTS

| | | | |
|---|---|---|---|
| 4,047,144 | 9/1977 | Wong ............................................ | 338/2 |
| 4,532,698 | 8/1985 | Fang et al. ................................. | 29/571 |
| 4,776,924 | 10/1988 | Delapierre .................................. | 438/52 |
| 5,021,355 | 6/1991 | Dhong et al. ............................... | 437/35 |
| 5,026,437 | 6/1991 | Neukermans et al. ................... | 148/33.3 |
| 5,198,390 | 3/1993 | MacDonald et al. .................... | 437/203 |
| 5,316,979 | 5/1994 | MacDonald et al. .................... | 437/203 |
| 5,334,868 | 8/1994 | Wong ........................................ | 257/244 |
| 5,391,506 | 2/1995 | TAda et al. ................................ | 437/41 |
| 5,397,904 | 3/1995 | Arney et al. ............................... | 257/66 |
| 5,420,074 | 5/1995 | Ohshima ................................... | 437/193 |
| 5,444,013 | 8/1995 | Akram et al. .............................. | 437/60 |
| 5,512,498 | 4/1996 | Okamoto ................................... | 437/35 |

*Primary Examiner*—Brian Dutton
*Attorney, Agent, or Firm*—Lumen Intellectual Property Services

[57] ABSTRACT

A method of forming electrical elements on the sidewalls of deformable micromechanical structures such as flexible, high aspect ratio beams. The micromechanical structure is made of a semiconductor material such as silicon. The method includes angled ion implantation at an angle non-normal to the substrate surface. The angle ensures that ions are implanted into appropriately oriented sidewalls. Multiple ion implantations can be performed to form electrical elements into different sidewalls. Masking techniques can be used to restrict the locations where ions are implanted. Alternatively, several different types of ion diffusion can be used to expose the sidewall in selected regions. The present invention can form conductive pathways which are continuous between perpendicular surfaces. This enables electrical elements on vertical surfaces to communicate with electronics on horizontal surfaces, for example. The dopant ion concentration and ion species can be controlled to form many different electrical elements. Resist masking techniques can be used to mask sidewall areas not desired to have electrical elements. The present invention can form piezoresistors, conductive paths, resistors, diodes, and capacitor electrodes, for example, on desired areas of a micromechanical structure sidewall.

25 Claims, 9 Drawing Sheets

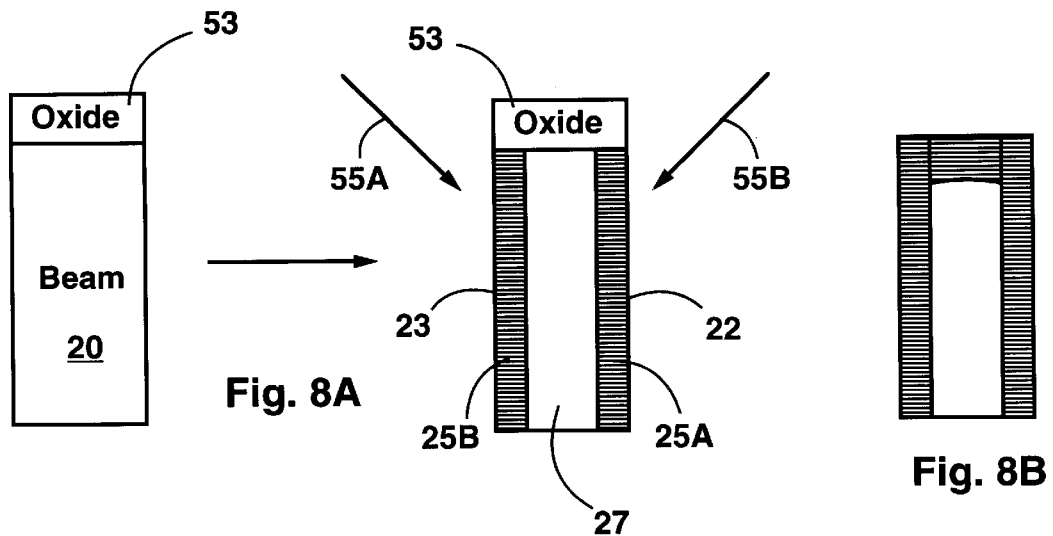
Fig. 8A
Fig. 8B
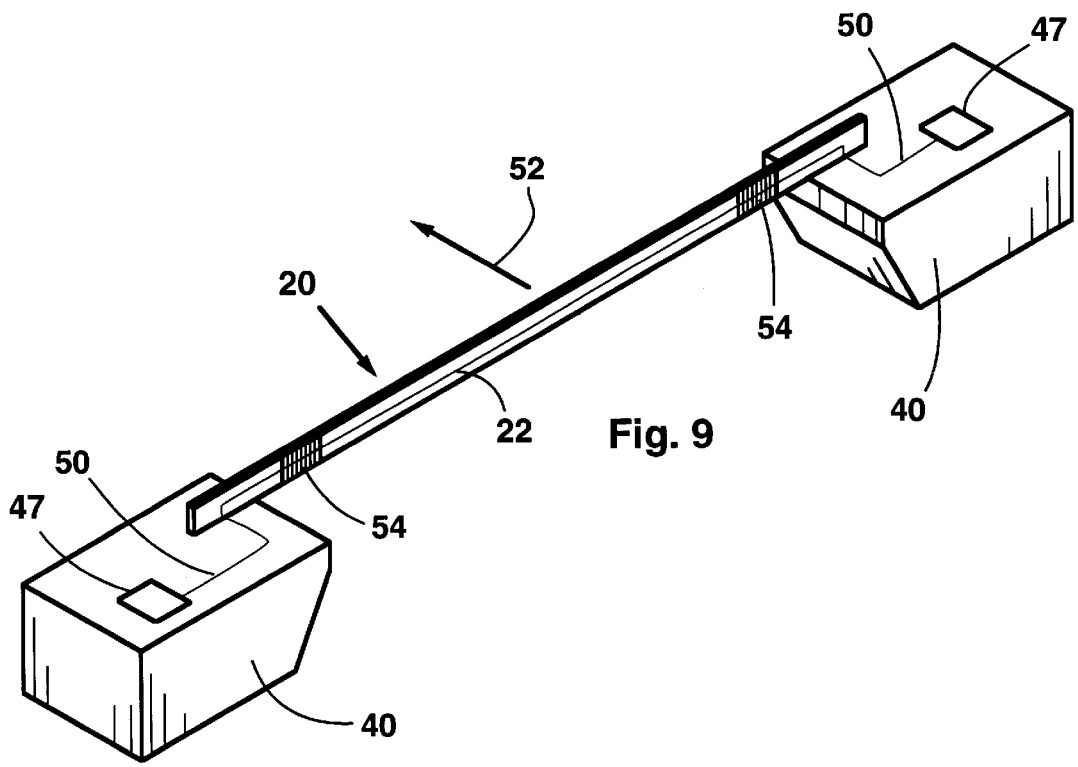
Fig. 9

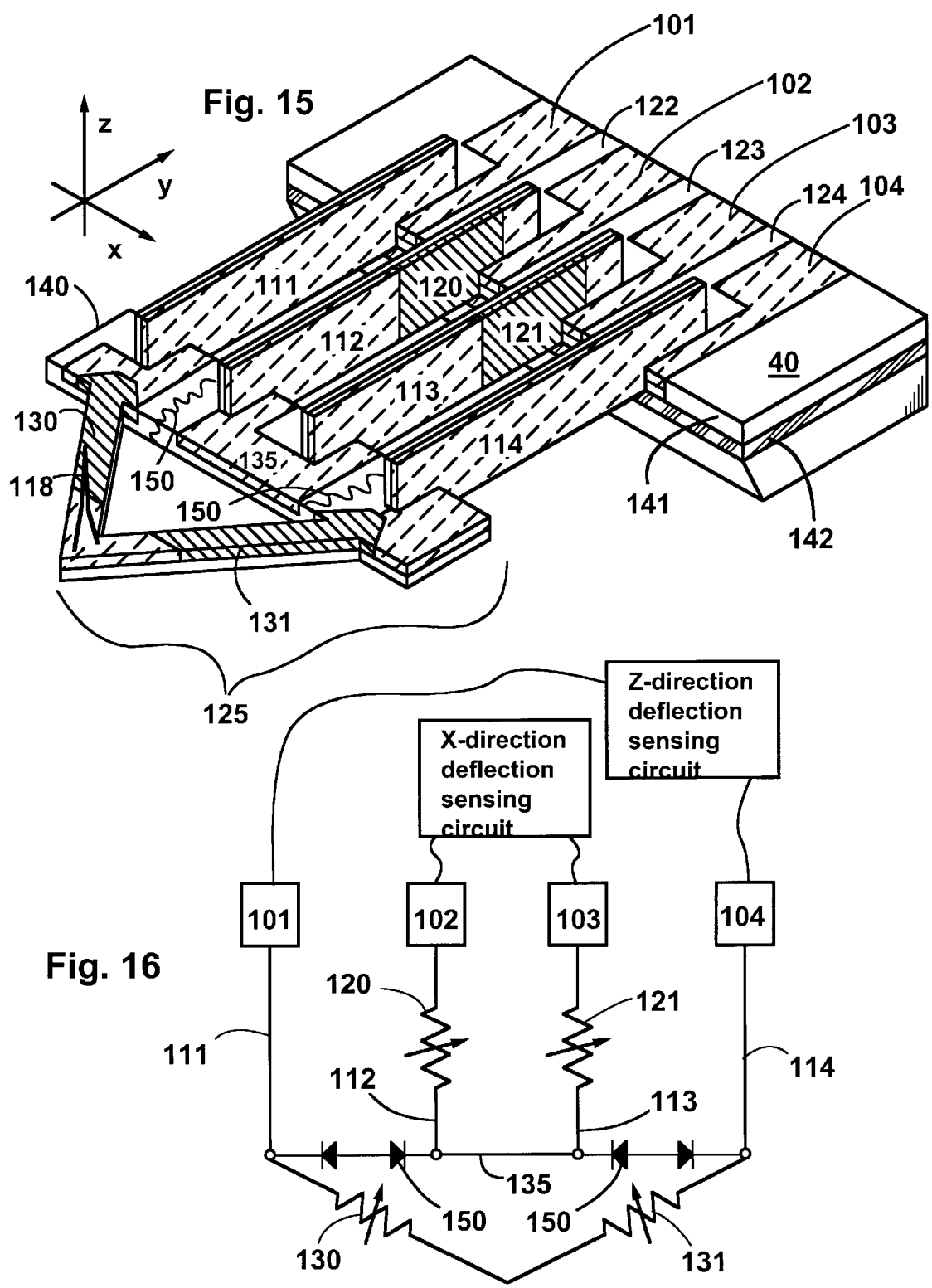

METHOD OF MAKING ELECTRICAL ELEMENTS ON THE SIDEWALLS OF MICROMECHANICAL STRUCTURES

FIELD OF THE INVENTION

This invention relates generally to micromechanical structures, and, more specifically, to micromechanical structures with piezoresistors or other electrical elements on the sidewalls.

BACKGROUND OF THE INVENTION

Semiconductor micromechanical structures have a wide range of applications including sensors and actuators. Different structures can be used as accelerometers, flow sensors, pressure sensors, or micromovable tips, for example.

In many micromechanical devices, electrical elements are included in order to provide localized heating, piezoresistive stress sensing, capacitive position sensing, or electrical connections. Diodes or other active devices can also be included. These electrical elements can be formed by judicious doping of different types and levels or by metallization traces.

Many micromechanical devices have thin, high aspect ratio, structural components. High aspect ratio beams, for example, can be oriented and positioned to preferentially respond to forces acting in specified directions. In other words, a high aspect ratio beam will have a preferred direction of compliance.

For example, a vertically oriented high aspect ratio beam is compliant in a lateral direction, parallel with the plane of the substrate surface.

The broad, vertical sidewalls of a vertical beam (as shown in FIG. 1) cannot be patterned with conventional impurity doping techniques which are intended for doping horizontal surfaces. This prevents the fabrication of electrical elements on these sidewalls. For example, it is particularly advantageous to fabricate piezoresistors on the beam sidewalls to sense lateral deflections of the beam. Other electrical elements could be fabricated on the sidewalls to provide a wide range of functions, including electrical connections between sensors and electronic circuitry.

The prior art includes methods and apparatus for fabricating electrical elements on the sidewalls of stationary integrated electronic devices. Also, the prior art includes methods for using sidewalls as a means for controlling the distribution of ions implanted at an angle. For example, U.S. Pat. No. 5,200,353 describes a method for making a trench capacitor by doping the sidewalls of a trench with an angled ion beam. This method is limited to stationary integrated circuit structures and, more particularly, to trenches used for trench capacitors. Similar methods for applying angled ion implantation for making integrated electronic devices can be found in U.S. Pat. Nos. 5,512,498, 5,391,506, 5,021,355, 4,532,698, 5,444,013, 5,334,868, and 5,420,074. Generally, these inventions use angled ion implantation to improve the operation of integrated electronic devices such as trench capacitors, CCD arrays, transistors or the like. There is no mention of micromechanical devices in these references. They are not applicable to forming electrical elements on the sidewalls of micromechanical devices. Ion diffusion into sidewalls has been used in the prior art as an etch resist mechanism. It is well known in the art that doped semiconductor material can have different etch characteristics compared to the undoped material. Specifically, boron doped silicon is resistant to etching by certain silicon etchants. This phenomenon has been exploited by some researchers to prevent the etching of sidewalls of microstructures. For example, in "A novel etch-diffusion process for fabricating high aspect ratio Si microstructures", *Technical Digest of the 1995 International Conference on Solid State Sensors and Actuators* (*Transducers* '95), by W. H. Juan, and S. W. Pang, there is described a method for diffusing dopant atoms into the sidewalls of high aspect ratio silicon microstructures. This technique is concerned only with preventing the etching of the sidewalls so that the structure can be released. No technique is provided for controlling which regions of the sidewall receive dopant. Thus, this technique is unsuitable for fabricating electrical elements on the sidewalls. The fabrication of electrical elements on a sidewall requires control over where on the sidewall the dopant atoms are incorporated.

In the current state of the art, there is no method for fabricating electrical elements on the sidewalls of deformable micromechanical structures. Such a method would allow a greater range of micromechanical devices to be fabricated and hence for a greater range of applications for micromechanical structures.

OBJECTS AND ADVANTAGES OF INVENTION

Accordingly, it is a primary object of the present invention to provide a method for making electrical elements on the sidewalls of deformable micromechanical structures. Particularly, it is an object of the present invention to provide such a method that:

1) is compatible with well known resist masking, ion implantation techniques and ion diffusion techniques;

2) can produce a wide variety of electrical elements with a range of characteristics, and specifically, can be used to form deformation-sensing piezoresistors;

3) can be used to make a wide variety of deformable micromechanical structures, including sensors and actuators;

4) can be used to create continuous electrical connections across corners, i.e., between connected horizontal surfaces and vertical sidewall surfaces or between two orthogonal vertical sidewall surfaces;

Other objects and advantages of the invention will become apparent upon reading the detailed description.

SUMMARY OF THE INVENTION

These objects and advantages are attained by ion implanting the deformable micromechanical structure at an angle nonnormal (nonvertical) to the substrate surface. Due to the nonnormal angle, dopant ions are implanted into the sidewalls of the structure. An ion implant resist mask can be used to select which regions of the sidewalls are implanted.

The doping level can be controlled by well known ion implantation techniques. Specifically, the ion flux and energy are controlled. The doping type is determined by the species of ions implanted.

Alternatively, dopant can be incorporated into the sidewall using ion diffusion techniques. The edge of a resist mask may, for example, parallel the sidewall. There are several well known diffusion techniques that can be used. Examples are proximity gas-phase diffusion (e.g., boron from heated boron nitride), diffusion from a doped silicon dioxide layer, and diffusion from a doped polysilicon layer.

The present invention can be used to make on the sidewall of a deformable micromechanical structure any electrical element that can be made by ion implantation or ion diffusion. Piezoresistors, conductive paths, diodes, resistors, and capacitor electrodes are examples. Such electrical elements can be used in a wide variety of movable micromechanical structures.

The present invention is particularly useful for making electrical elements on the sidewalls of flexible beam structures such as free standing beams or cantilevered beams.

A particularly useful feature of the present invention is that it can create continuous electrical pathways across the corners between horizontal surfaces and vertical sidewalls. This is useful because it allows electronics fabricated on horizontal surfaces to communicate with electrical elements on vertical sidewall surfaces. Corners are often present in structures that have beams.

Another particularly useful feature of the present invention is that it can be used to form piezoresistors on the sidewalls of high aspect ratio flexible beams. These piezoresistors can be used to sense the degree of bending in the beams if they are positioned in regions that are deformed when the beam is bent. In the case of cantilevered beam, for example, the piezoresistor is preferably mounted close to where the beam is connected to the substrate. The piezoresistors can communicate with supporting circuitry through conductive paths formed by the method.

A detailed description of the implantation method is presented in the description section in reference to the attached drawing figures.

DESCRIPTION OF THE FIGURES

FIG. 8A is a cross sectional side view of a beam with an isolated electrical element on each sidewall of the beam.

FIG. 8B is a cross sectional side view illustrating how the electrical elements of FIG. 8A can be connected.

FIG. 9 is a force-sensing structure which can be made using the method of the present invention.

FIG. 15 shows a vertical and lateral deflection sensor that can be made using the method of the present invention.

FIG. 16 shows the electrical circuit of the device of FIG. 15.

DETAILED DESCRIPTION

Figure 1:
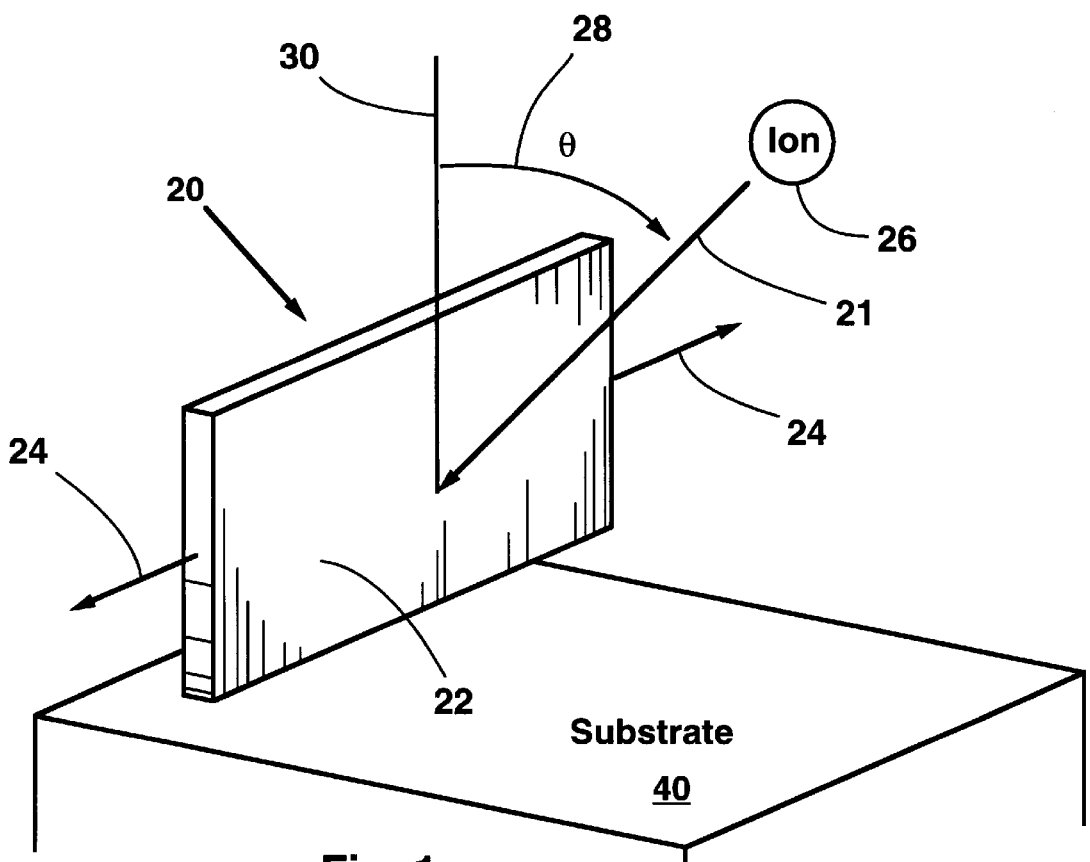
FIG. 1 is a closeup view of the angled ion implantation method of the present invention.

FIG. 1 shows a closeup view of the preferred method of the present invention. A micromachined silicon high aspect ratio flexible beam 20 has a vertical sidewall 22. The beam 20 may have cross sectional dimensions of approximately 1×10 microns. The beam 20 extends in the direction of the arrows 24. The beam 20 is free standing and is supported at a location not shown in the drawing. The sidewall 22 of the beam is implanted with dopant ions 26 at an angle θ 28 with respect to the substrate surface normal 30. Implanting 21 the ions 26 at an angle 28 sufficient to alter the electrical characteristics of the sidewall 22 is an essential feature of the present invention.

Dopant ions 26 can form a number of electrical elements on the sidewall 22 of the flexible beam 20. Resistors, piezoresistors, diodes and electrical contacts are examples of elements that can be formed with the method of the present invention. The electrical characteristics of the implanted regions are determined by the dopant ion species, the ion concentration and the implant depth.

The angle θ, ion flux, and ion implantation energy are selected such that a desired concentration of incident ions are implanted at a desired depth. It is well known in the art how to control the angle θ, ion flux and the ion implantation energy to achieve a doping of desired depth and concentration to form desired electrical elements. Specifically, the implant angle θ is determined by geometrical considerations.

Figure 2:
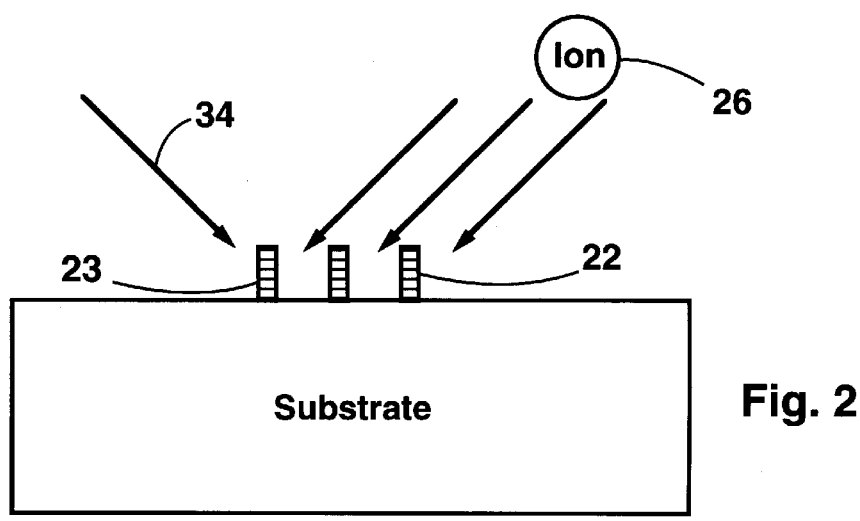
FIG. 2 is a side view of the angled ion implantation method.

The preferred method of the present invention uses angled ion implantation to dope the sidewall 22. FIG. 2 shows a side view of the angled ion implantation method. Here, sidewalls 22 of three parallel beams are implanted with dopant ions 26. The beams are spaced apart, and ions implanted at a sufficient angle such that the entire sidewall 22 of each beam receives dopant ions 26. Alternatively, it may be desirable to space the beams such that only a portion of each sidewall is implanted. FIG. 2 also shows ion implantation in a second, opposing direction 34 to implant a second surface 23 (the reverse sidewall) of the beams. It is within the scope of the present invention to perform multiple implantations at different angles to implant different sidewalls. The implantation illustrated in FIG. 2 is performed on beams that are still attached to the substrate. The method of the present invention can be used on released beams, or on beams that have not been released. It most circumstances it is beneficial to release the structures after ion implantation, so as to minimize to number of processing steps to be performed on the fragile, released structures.

The release can be performed by well known release processes. The SCREAM process or variations of the SCREAM process, for example, can be used to fabricate and release the beam 20. Reference can be made to *Technical Digest of the* 1991 *International Conference on Solid State Sensors and Actuators* (*Transducers* '91) pp. 520–523. The SCREAM process is also described in U.S. Pat. Nos. 5,198, 390 and 5,316,979. Other well known release techniques include using a backside etch on a substrate with a buried oxide layer which acts as an etch stop, followed by an HF etch to remove the buried oxide layer.

Figure 3:
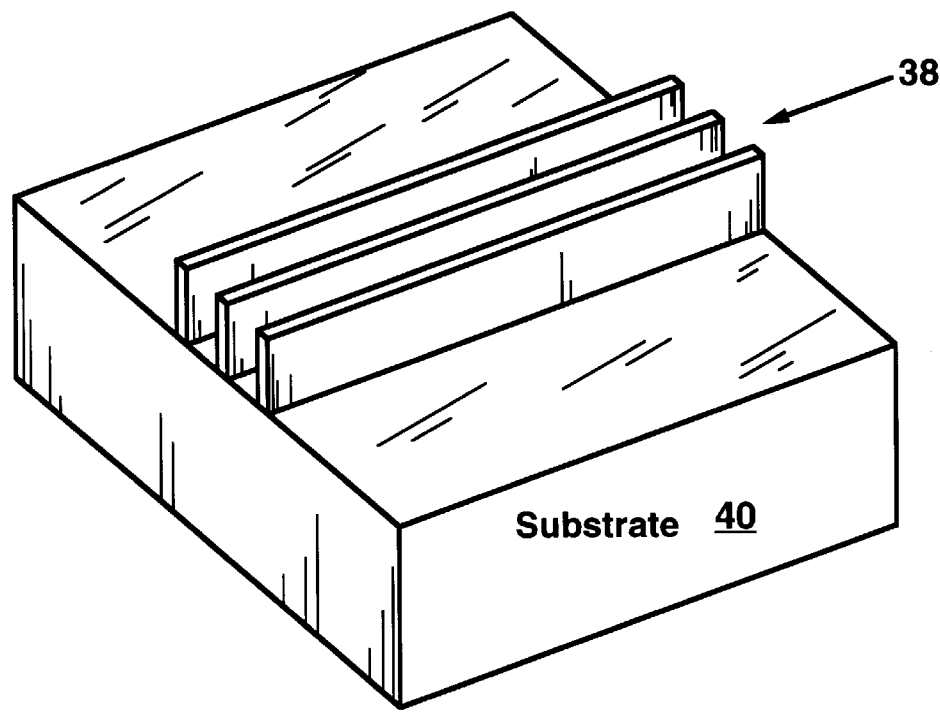
FIG. 3 is a deformable micromechanical structure which can have electrical elements formed on the sidewalls thereof.
Figure 4:
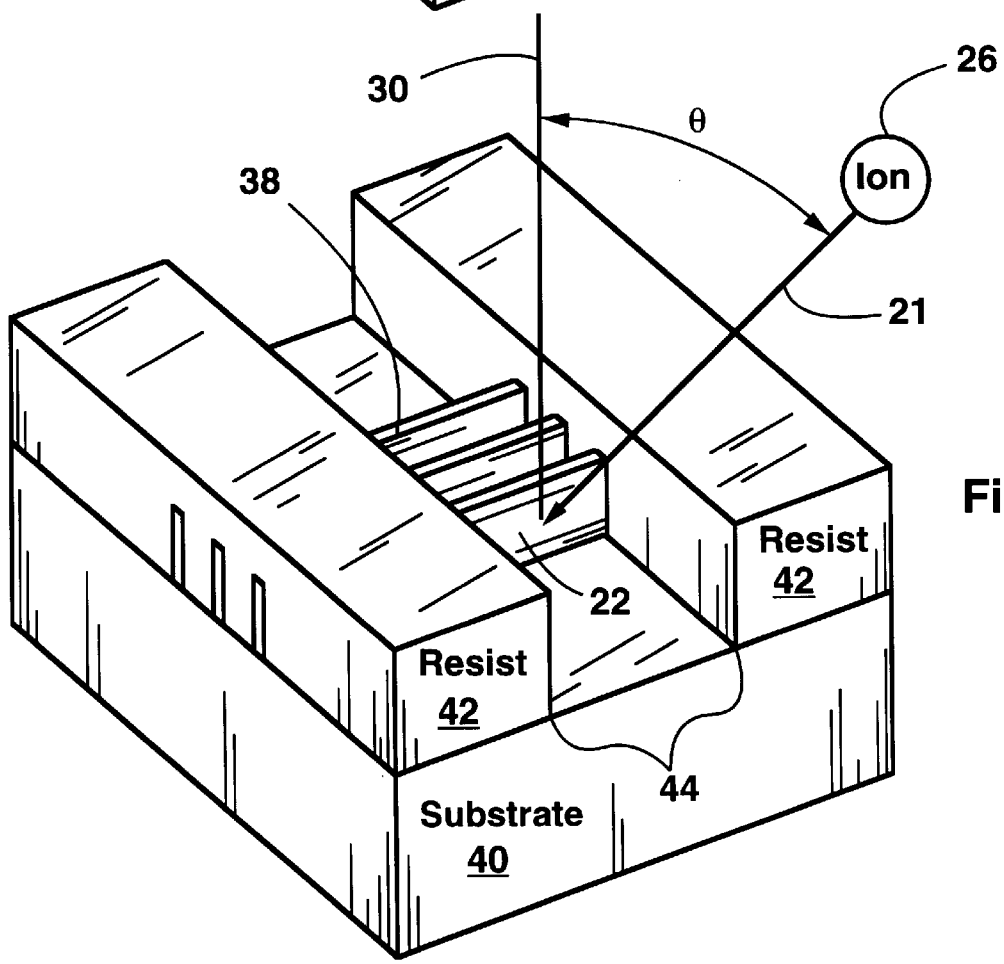
FIG. 4 is the structure of FIG. 3 with a resist mask deposited and etched to expose the underlying structure to ion implantation.

FIGS. 3 and 4 illustrate a method by which different regions of a sidewall can be selected to receive implanted ions during different ion implantation steps. FIG. 3 shows the structure to be implanted. It consists of three parallel beams 38 still attached to a substrate 40. The beams 38 are released from the substrate 40 after being implanted with dopant. This ordering minimizes the number of processes performed on the beams 38 while they are freestanding. It is well known in the art that it is advantageous to perform the release step late in the fabrication process in order to avoid damaging the fragile, freestanding beams. A mask of resist material 42 is coated on the structure such that it completely covers the beams 38 and substrate 40. The resist material 42 can be photoresist. The resist material 42 is then etched away in predetermined regions 44 using well known lithography and etching techniques. FIG. 4 shows the structure after the predetermined regions 44 of resist 42 have been etched away. Resist 42 is only removed from regions of the structure designated to be ion implanted. Exposing the structure to angled ion implantation 21 will implant the sidewalls 22 of the beams 38 in locations 44 where the resist 42 has been removed. The resist 42 is subsequently removed and the beams 38 released from the substrate 40. It will be obvious to one skilled in the art of ion implantation and micromachining that the masking method described above can be applied to many different micromechanical structures in addition to the sidewalls of the beams illustrated.

Figure 5A:
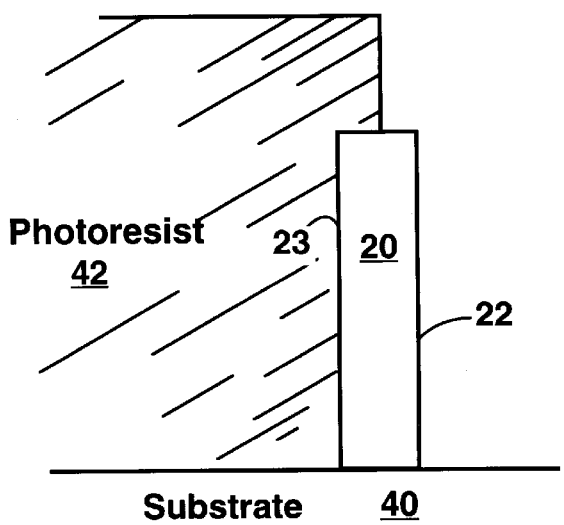
FIG. 5A is a cross sectional side view of a beam with photoresist mask exposing one sidewall.
Figure 5B:
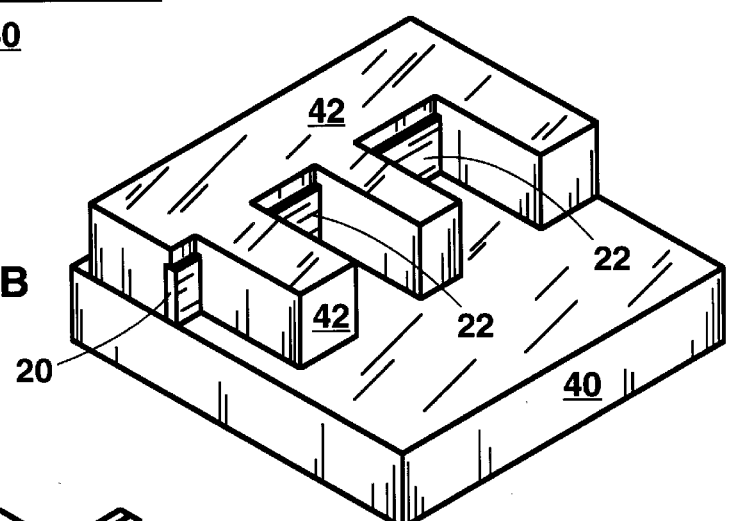
FIG. 5B is a figure illustrating how photoresist can be deposited and etched to expose a sidewall in selected regions.
Figure 5C:
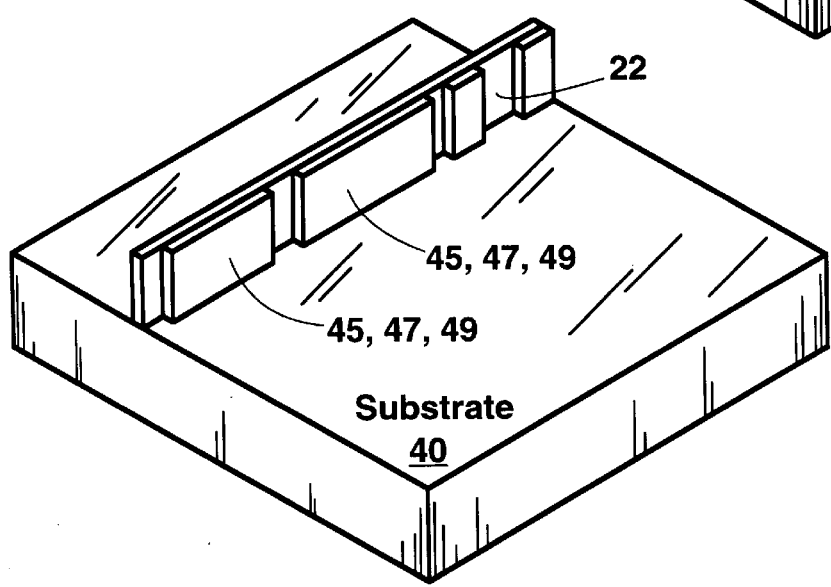
FIG. 5C is a figure illustrating materials (mask materials or dopant sources) deposited on selected regions of a sidewall.

A second embodiment of the present invention includes methods for doping sidewalls using ion diffusion techniques. FIG. 5A shows a cross sectional side view of a beam 20 with the reverse sidewall 23 covered with photoresist 42. The other sidewall 22 is exposed. FIG. 5B shows a perspective view of how photoresist 42 can be patterned to expose predetermined regions of one sidewall of a micromachined structure. The ability to pattern photoresist 42 such that one sidewall (sidewall 22) is exposed in predetermined regions is an essential feature of the present ion diffusion method. It is noted that photoresist 42 cannot be directly used to mask where ions are allowed to diffuse into the sidewalls 22, 23. This is because ion diffusion is performed at elevated temperatures and photoresist 42 is typically not heat resistant. However, the patterned photoresist 42 can be used to determine where heat-resistant diffusion mask material (such as silicon dioxide) or dopant sources (such as doped oxide) are deposited. FIGS. 5A, 5B and 5C shows the beam 20 as being attached to the substrate 40 because it is best to release the beam 20 from the substrate 40 after all ion doping steps have been completed.

There are several ion diffusion processes that can be used to dope the sidewall 22. Some examples are as follows:

Using Doped Silicon Dioxide as a Dopant Source

1) A doped silicon dioxide layer containing the desired dopant is conformally deposited on the microstructure.

2) Photoresist 42 is used to cover those regions desired to receive dopant. In other words, the photoresist 42 is etched to expose oxide-covered sidewalls in regions where dopant is not desired. The photoresist can be etched as shown in FIG. 5A and 5B to expose one sidewall of a beam. Not shown in FIG. 5A or 5B is the oxide layer.

3) The oxide is then removed in exposed regions with an oxide etch such as HF. The oxide remains in regions desired to be doped.

4) The photoresist 42 is removed. The microstructure may then appear as in FIG. 5C, with doped oxide regions 45 adhered to a sidewall 22.

5) A high temperature annealing step promotes the diffusion of dopant ions from the oxide regions 45 to the sidewall 22.

6) The oxide 45 can then be removed, or can remain on the sidewall 22.

Using Doped Polysilicon or Epitaxy as a Dopant Source

1) A doped polysilicon or epitaxial layer is conformally deposited on the microstructure.

2) Photoresist 42 is used to cover only those regions desired to receive dopant. In other words, the photoresist 42 is etched to expose polysilicon-covered (or epitaxy-covered) sidewalls in regions where dopant is not desired.

3) The polysilicon (or epitaxy) is removed in exposed regions. This can be done with a timed isotropic plasma etch. An $SF_6$ or $CF_4$ plasma etch can be used in the case of silicon.

4) The remaining photoresist is removed. The polysilicon layer may then appear as in FIG. 5C, with polysilicon regions 47 adhered to a sidewall 22.

5) A final, optional high temperature diffusion step can be performed to diffuse the dopant into the microstructure.

Masked Diffusion

1) An undoped, heat-resistant diffusion mask is conformally deposited on the microstructure. Silicon dioxide, silicon nitride or silicon carbide can be used, for example. The mask must be thick enough to prevent the dopant ions from diffusing all the way through.

2) The mask is removed in regions desired to be doped. A photoresist masking step followed by HF wet etching can be used in the case of an oxide mask, for example. The mask may then appear as in FIG. 5C, with mask regions 49 adhered to a sidewall 22.

3) The microstructure is heated to an elevated temperature and exposed to a dopant source. The dopant source can be a vapor ($PH_3$, $SbH_3$, $AsH_3$, or $B_2H_6$, for example), a liquid ($POCl_3$, $Sb_3Cl_5$, or $BBr_3$, for example), a heated solid ($NH_4H_2PO_4$, $Sb_2O_3$, $As_2O_3$, or BN, for example), or a spin-on chemical source (phosphorosilica, antimonysilica, arsenosilica, or borosilica, for example). During this step, dopant ions diffuse into the sidewall 22 in regions where it is exposed through the diffusion mask 49.

4) Optionally, the diffusion mask 49 may be removed after ion diffusion.

As is apparent in FIG. 5B, the above described ion diffusion methods can be used to pattern sidewalls with dopant ions. It is well known in the art of micromachining that it is best to release the structures after ion diffusion, so as to minimize to number of processing steps to be performed on the fragile, released structures.

It is noted that the method of the present invention is restricted for use with deformable micromechanical structures with sidewalls. Examples include flexible, high aspect ratio beams or thin micromechanical structures.

It is known in the art of ion implantation and ion diffusion that different concentrations and types of dopant can produce regions with different electrical characteristics. Light doping of boron into silicon, for example, produces regions that have relatively significant piezoresistive behavior. Heavy boron doping produces regions that are highly conductive with insignificant piezoresistive behavior. The piezoresistive and conductive properties of doped semiconductors are known in the art.

It is well known that the orientation of a piezoresistor with respect to the crystal structure of a semiconductor material can significantly affect the properties of the piezoresistor. The orientation of electrical current flow can also be important. For example, in P-type (e.g., boron-doped) silicon, the (−1 1 1), (−1 1 −1), (1 −1 1), and (1 −1 −1) directions (direction of current flow) in the (110) crystal plane have relatively high longitudinal coefficients of piezoresistivity. The minus signs in the above crystal direction shorthand indicate negation which is usually represented by an overbar. The dependence of piezoresistive properties upon crystal orientation is well known in the art of semiconductor physics. Reference can be made to "A Graphical Representation of the Piezoresistance Coefficients in Silicon", by Yozo Kanda, *IEEE Transactions on Electron Devices,* Vol. ED-29, No. 1, January, 1982.

Piezoresistive regions doped in the sidewalls of deformable micromechanical structures can be used to sense deformation in the structures. Deformation in micromechanical structures can be caused by forces acting on the structure such as magnetic, inertial, gravitational, electrostatic, pressure, frictional, or viscous fluid flow forces. In this way, piezoresistors made by the method of the present invention can be used to sense such forces.

In some applications of the present invention, it may be desirable to implant dopant ions in certain, well-defined regions of a sidewall. For example, it may be desirable to implant P and N type dopants adjacent to one another in order to form a diode on a sidewall. Also, in many applications of piezoresistors, it may be necessary to localize the region of piezoresistivity.

Figure 6:
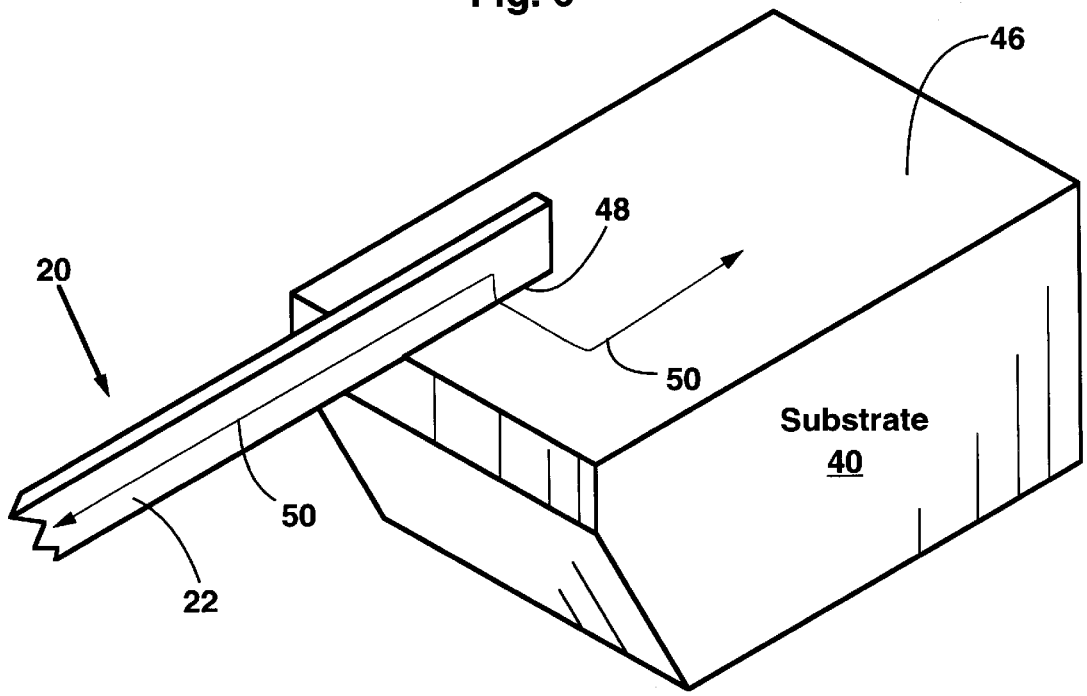
FIG. 6 is a structure with a continuous electrical connection formed between a horizontal surface and a vertical sidewall surface.

FIG. 6 illustrates a particularly useful advantage and feature of the present invention. In many applications, it may be necessary to make electrical connections between a vertical sidewall 22 and horizontal surface 46. In other words, a continuous electrical connection may need to be formed across a corner 48. A continuous electrical pathway 50 between the vertical sidewall 22 of a beam 20 and a horizontal surface 46 of a substrate 40 can be formed by the angled ion implantation or ion diffusion methods of the present invention. This is because both methods can dope both vertical 22 and horizontal surfaces 46 simultaneously. Of course, there must not be any irregularities or structures on the horizontal or vertical surfaces which create 'shadows'. Shadows are formed by obstructions which block the incoming ions. Shadowing may not be an important concern if ion diffusion techniques are used.

Figure 7:
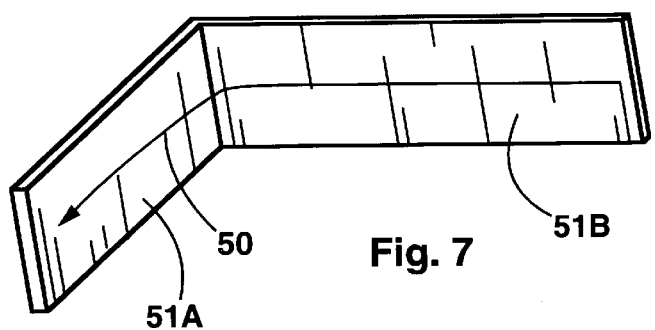
FIG. 7 is a structure with a continuous electrical connection formed between two vertical sidewall surfaces.

FIG. 7 illustrates a continuous electrical connection 50 between two vertical sidewalls 51A, 51B which can be made using the present invention.

It is also possible with the present invention to make a single beam 20 with two electrically isolated electrical elements on opposite sidewalls 22, 23 of the beam. Two electrical conductors or piezoresistors, for example, can be formed independently. FIG. 8 shows cross sectional views illustrating how this can be done. First, a thick oxide layer 53 is formed on top of the beam 20. The oxide layer 53 can be the mask for a deep etching step that forms the beam 20 earlier in the beam fabrication process. The oxide layer 53 is sufficiently thick such that incident dopant ions cannot penetrate it. Next, two angled ion implantations 55A, 55B are performed from opposing directions, forming doped regions 25A, 25B in the front 22 and reverse 23 sidewalls.

The oxide layer 53 prevents the dopant ions from reaching the top surface of the underlying silicon beam, keeping the two doped regions 25A, 25B physically separate. It is known in the art to electrically isolate doped regions by separating them with a region of the opposite conductivity type. For example, if the doped regions 25A, 25B are doped P-type, then the middle 27 of the beam (i.e., the starting material) should have N-type doping. Including a break in the oxide layer 53 can provide an electrical connection between the two doped regions 25A, 25B because the top surface of the beam will then be doped. A cross sectional view in a region without an oxide layer 53 is shown in FIG. 8B. It is noted that ion diffusion techniques can also be used to form isolated electrical elements on front 22 and reverse 23 sides of a beam.

It is also possible to connect the electrical elements on opposite sidewalls 22, 23 of a beam by implanting ions and then heating the structure to diffuse the ions throughout the thickness of the beam. In other words, the two implanted regions 25A, 25B are spread by diffusion until they overlap. A resist mask 42 can be provided to localize the region where a connection is established by this method. In this case, the mask 42 controls where ions are deposited. Of course, it is also possible to use an ion diffusion process to establish a connection between the two sides 22, 23.

Figure 10:
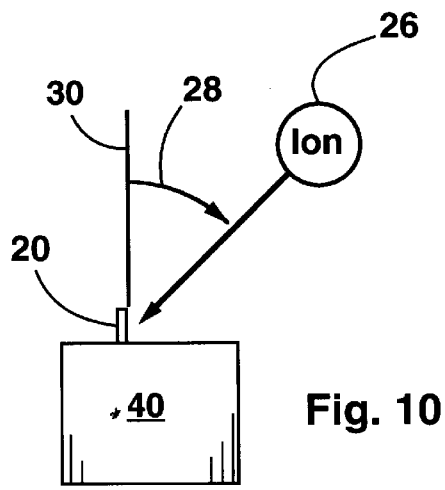
FIG. 10 is side view illustrating the angled ion implantation used to make the force sensing structure of FIG. 9.

FIG. 9 shows a generalized lateral force sensor that can be made by the method of the present invention. A free standing beam 20 is supported by two substrate pedestals 40 of substrate material. The beam 20 can deflect in response to forces applied in the direction of the arrow 52 shown. The sidewall 22 of the beam 20 is ion implanted at an angle so that two piezoresistors 54 and a conductive pathway 50 are formed. FIG. 10 shows an end-on view of the sensor during ion implantation, illustrating the angle 28 at which ion implantation 21 is performed. Ion diffusion can also be used to form the conductive pathway 50 and piezoresistors 54. The conductive pathway 50 is indicated by the line shown. It is noted that the conductive pathway 50 is continuous from the horizontal surfaces 46 of the substrate pedestals 40 to the vertical surface of the beam sidewall 22. In this way, the piezoresistors 54 can be monitored by electronics 47 fabricated on the horizontal surfaces 46 of the substrate pedestals 40. An alternate embodiment of this device may use only one piezoresistor 54.

The piezoresistors 54 change in resistance in response to the amount of the deflection of the beam. The piezoresistors 54 can be formed by light boron doping (if the structure is made of silicon). The remainder of the conductive pathway 50 of the structure can be made highly conductive by heavy boron doping. The piezoresistors 54 are located close to where the beam 20 is connected to the substrate pedestals 40, which is where the deformation of the beam 20 is greatest for a given applied force 52. Locating the piezoresistors 54 at points of high deformation maximizes the sensitivity to deformation and therefore the sensitivity to applied forces 52.

The device of FIG. 9 can be made by first lightly doping the regions desired to be highly conductive 50 or piezoresistive 54, rendering all these regions piezoresistive. Next, a mask is deposited only in regions that are to be piezoresistive 54. The structure is then exposed to heavy boron doping. All the regions except those covered by the mask will become highly conductive. The covered regions 54 will remain piezoresistive. Finally, the mask is removed. Masking and doping steps can be repeated with different dopants, ion implantation parameters, or ion diffusion parameters to form diodes or other devices on the sidewalls 22 of the beam 20.

Figure 11:
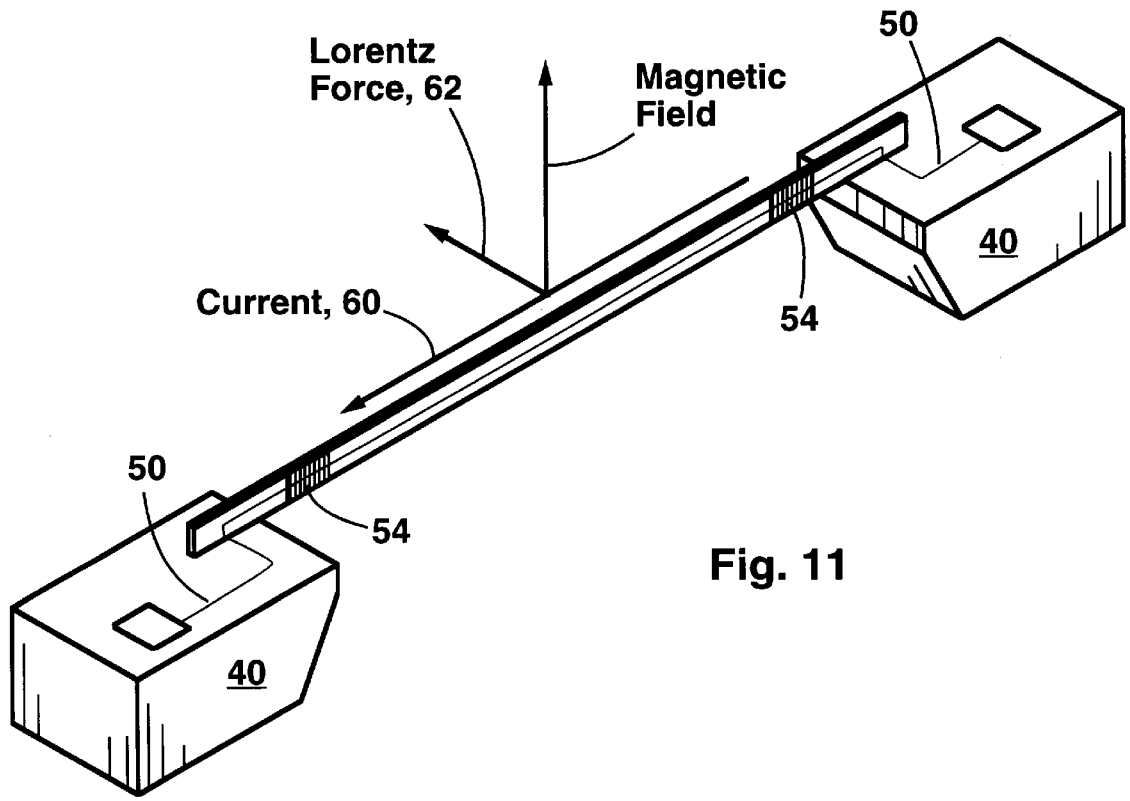
FIG. 11 illustrates how the structure of FIG. 9 can be used as a magnetic field sensor.

The sensor of FIG. 9 can be used to sense many different kinds of forces. Placing a mass in the middle of the beam 20, for example, produces an acceleration sensor. FIG. 11 shows a magnetic field sensor. Passing a current 60 down the length of the beam 20 through a conductive path formed on the reverse sidewall 23 (hidden from view) of the beam can produce a magnetic field sensor which measures the resultant Lorentz force 62. The structure can also be placed in flowing, viscous fluid to produce a flow sensor which responds to flow perpendicular to the length of the beam 20. It will be obvious to one skilled in the art of microelectromechanical devices that the methods of the present invention can be used to manufacture a variety of sensors by forming piezoresistors 54 on the sidewalls of deformable structures.

Figure 12:
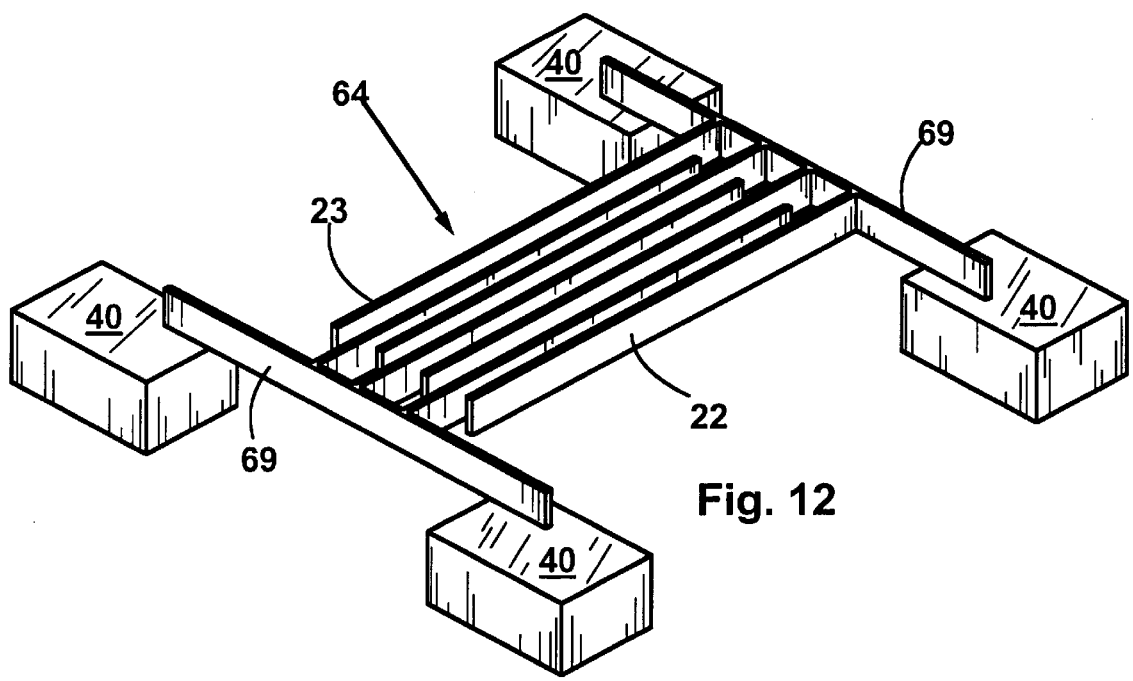
FIG. 12 shows an interdigitated micromechanical structure as commonly used in some microelectromechanical devices.
Figure 13:
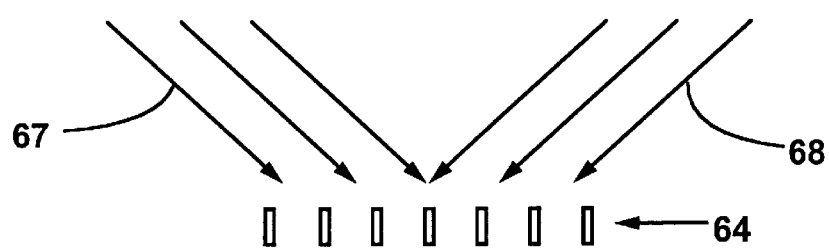
FIG. 13 shows how the sidewalls of the beams of the structure of FIG. 12 can be ion implanted to form electrical elements on the sidewalls.

FIG. 12 shows an interdigitated structure with seven beams 64. In many micromechanical devices, such interdigitated structures are used as capacitive transducers. For example, the capacitance between the interleaved digits can change with applied forces such as inertial forces. Interdigitated structures can also be used as electrostatic actuators such as capacitive comb drives. Such devices are known in the art of micromechanical structures. In all the above mentioned interdigitated structures it is necessary to have beams 64 with conductive sidewalls 22 to act as capacitor electrodes. Angled ion implantation or masked ion diffusion can be used to render the sidewalls 22 of the interdigitated beams 64 highly conductive. Two ion implantation steps at opposing angles are required if both sides of each beam 64 are to be implanted. FIG. 13 shows a side view of two ion implantation steps 67, 68 at opposing angles that can be used to implant both sidewall surfaces of each of the interdigitated beams 64. It will be obvious to one skilled in the art how to perform multiple ion implantation or ion diffusion steps to establish an electrical connection between sidewalls 22, 23 of interdigitated beams 64 and sidewalls of backbone beams 69.

Figure 14:
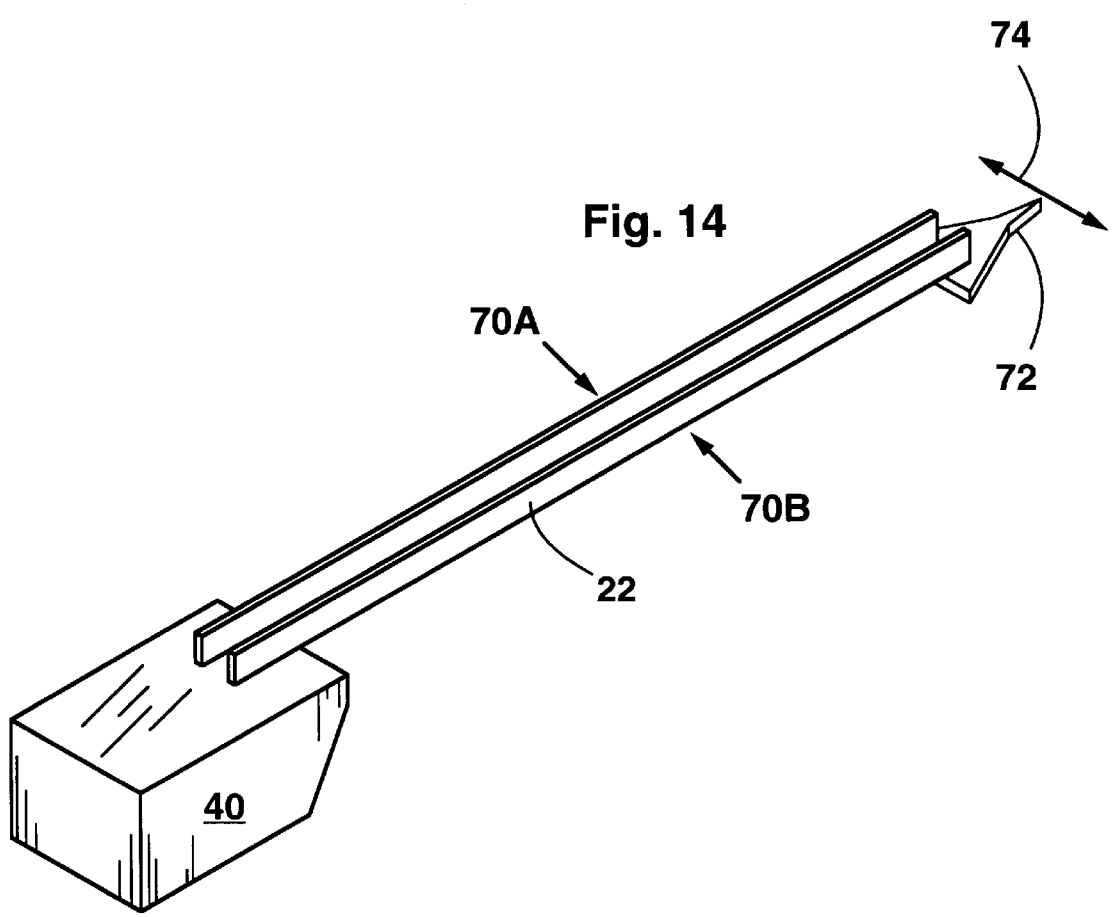
FIG. 14 shows an actuator which can be made using the method of the present invention.

The present invention can also be used to make actuators. FIG. 14 shows an actuator which can be made by the method of the present invention. Two free standing flexible support beams 70A, 70B which are mounted on a substrate 40 support a tip 72. The tip 72 can be moved side to side in the direction of the arrow 74 shown. The movement of the tip 72 is caused by heating one support beam 70A more than the other 70B. The mechanism is analogous to that of a bimetallic strip. Preferential heating can be accomplished by passing electrical current through resistors implanted into the sidewalls 22 of each beam 70A, 70B. Each support beam 70A, 70B can have sidewall-implanted resistors with different resistance values, resulting in different amounts of heating for each beam 70A, 70B. Both beams 70A, 70B can be part of a single circuit: current flows from the substrate 40, up one beam 70A, across the tip 72, down the second beam 70B, and returns to the substrate 40. Alternatively, each beam 70A, 70B can comprise its own circuit by forming isolated conductive paths on each sidewall of each beam. The relative heating in each beam 70A, 70B can be determined by the relative magnitude of $I^2R$ heating. Alternatively, the beams 70A, 70B can be designed differently such that one beam experiences more efficient cooling than the other. Other actuators operating by means of asymmetrical thermal expansion are known in the art of micromachines.

FIG. 15 shows a vertical and lateral deflection sensor that can be made using the present invention. Vertical (Z direction) and lateral (X direction) forces applied to the tip 118 can be independently measured. Four beams 111, 112, 113, 114 extend from a substrate base 40 and suspend a triangular tip section 125. All the hatched regions of the figure are highly conductive or piezoresistive as a result of boron implantation. Beam sidewall regions 120, 121, and tip section 125 surfaces 130, and 131 are piezoresistive.

The piezoresistors 130, 131 of the tip section 125 detect vertical forces. Electrical connections to the vertical sensing piezoresistors 130, 131 are provided by the two outer beams 111, 114. The entire length of the sidewalls of the two outer beams 111, 114 are made highly conductive by the method of the present invention. The electrical circuit for sensing vertical deflections is shown in FIG. 16.

The two inner beams 112, 113 have sidewall-implanted piezoresistors 120, 121 which sense lateral deflections of the tip 118. The two inner beams 112, 113 are connected via a conductive region 135 on the base 140 of the triangular tip section. The electrical circuit for sensing lateral deflections is shown in FIG. 16.

Beams 111, 112, 113, 114 have a high aspect ratio and therefore have a preferred direction of compliance. In other words, they bend more easily in the lateral direction than in the vertical direction. Similarly, the tip section 125 has a perpendicularly oriented high aspect ratio and therefore bends most easily in the vertical direction. In this way, vertical and lateral forces affect different piezoresistors in the structure and are therefore independently measured.

The vertical and lateral deflection sensing circuits are insulated from one another by back-to-back diodes 150 located on the base 140 of the triangular tip section 125. The diode pairs 150 are located between beams 111 and 112, and between beams 113 and 114. The diodes 150 are also shown in the equivalent electrical circuit of FIG. 16.

The regions 122, 123, 124 between the four beams 111, 112, 113, 114 where they are connected to the substrate 40 also need to provide electrical isolation for the beams. This can be done by using back-to-back diodes, i.e. have regions 122, 123, 124 be of a dissimilar conductivity-type to that of contact pads 101, 102, 103, 104 or, alternatively, by etching through the top silicon layer 141 to the buried oxide layer 142 in regions 122, 123, 124.

All the piezoresistors and conductive regions of the vertical and lateral deflection sensor of FIG. 15 can be made using the angled ion implantation or ion diffusion methods of the present invention. Only one sidewall of each beam 111, 112, 113, 114 is used in this case. The paired diode junctions 150 can be made using the present invention by doping dissimilar conductivity-type dopants into adjacent regions. It is understood that the present invention can create continuous electrical paths between horizontal and vertical surfaces as present in the device of FIG. 15.

It is noted that the present invention is not limited for use on beam-type structures. The present invention can be used to dope the sidewalls of any deformable micromechanical structure wherein the sidewalls are inclined at an angle with respect to the device substrate surface.

It is also noted that while boron is often the preferred dopant for forming electrical elements (e.g. piezoresistors) in silicon, the methods of the present invention can also be used with any other impurity dopants including phosphorus, arsenic, antimony, gallium, indium, and aluminum.

It will be clear to one skilled in the art that the above embodiment may be altered in many ways without departing from the scope of the invention. Accordingly, the scope of the invention should be determined by the following claims and their legal equivalents.

What is claimed is:

1. A method of forming electrical elements on a sidewall of a deformable micromechanical structure made of a semiconductor material, said method comprising the steps of:

1) forming a heat resistant ion diffusion mask on said sidewall such that said sidewall has exposed regions to be doped;

2) diffusing impurity atoms into said exposed regions, wherein the impurity atoms are diffused in a concentration sufficient to change the electrical characteristics of said sidewall, and wherein said impurity atoms are diffused from an impurity atom source.

2. The method of claim 1 wherein said impurity atom source is a vapor selected from the group consisting of $PH_3$, $SbH_3$, $AsH_3$, and $B_2H_6$.

3. The method of claim 1 wherein said impurity atom source is a liquid selected from the group consisting of $POCl_3$, $Sb_3Cl_5$, and $BBr_3$.

4. The method of claim 1 wherein said impurity atom source is a heated solid selected from the group consisting of $NH_4H_2PO_4$, $Sb_2O_3$, $As_2O_3$, and BN.

5. The method of claim 1 wherein said impurity atom source is a coating selected from the group consisting of phosphorosilica, antimonysilica, arsenosilica, borosilica.

6. The method of claim 1 wherein said mask material is selected from materials in the group comprising silicon dioxide, silicon nitride, and silicon carbide.

7. The method of claim 1 wherein said electrical elements are selected from the group consisting of piezoresistors, conductive paths, resistors, diodes, and capacitor electrodes.

8. The method of claim 1 wherein said semiconductor material is selected from the group consisting of silicon, gallium arsenide, germanium, silicon-germanium, and silicon carbide.

9. The method of claim 1 wherein said impurity atoms are selected from the group consisting of boron, phosphorus, arsenic, antimony, gallium, indium, and aluminum.

10. The method of claim 1 wherein said sidewall is a sidewall of a flexible beam.

11. A method of forming electrical elements on a sidewall of a deformable micromechanical structure made of a semiconductor material, said method comprising the steps of 1) depositing a solid impurity atom source on regions of said sidewall to be doped;

2) heating said micromechanical structure to diffuse impurity atoms from said atom source into said sidewall, wherein the impurity atoms are diffused in a concentration sufficient to change the electrical characteristics of said sidewall.

12. The method of claim 11 wherein said impurity atom source is a layer of doped silicon dioxide.

13. The method of claim 11 wherein said impurity atom source is a layer of doped polysilicon.

14. The method of claim 11 wherein said impurity atom source is a doped epitaxial layer of said semiconductor material.

15. The method of claim 11 wherein said electrical elements are selected from the group consisting of piezoresistors, conductive paths, resistors, diodes, and capacitor electrodes.

16. The method of claim 11 wherein said semiconductor material is selected from the group consisting of silicon, gallium arsenide, germanium, silicon-germanium, and silicon carbide.

17. The method of claim 11 wherein said impurity atoms are selected from the group consisting of boron, phosphorus, arsenic, antimony, gallium, indium, and aluminum.

18. The method of claim 11 wherein said sidewall is a sidewall of a flexible beam.

19. A method for forming electrical elements on a sidewall of a deformable micromechanical structure made from a semiconductor substrate having a substrate surface, wherein the sidewall is not parallel with the substrate surface, the method comprising the steps of:

a) implanting dopant ions at an angle non-normal to the substrate surface, wherein the angle is selected such that the dopant ions are implanted into the sidewall in a concentration sufficient to change the electrical characteristics of the sidewall;

b) forming two electrical contacts spaced apart along a length of the sidewall such that electrical current flowing between the electrical contacts flows in a direction parallel with the substrate surface.

20. The method of claim 19 further comprising the steps of:

c) selecting regions of the sidewall that are to receive the dopant ions;

d) masking said deformable micromechanical structure such that the dopant ions are implanted in the selected regions of the sidewall.

21. The method of claim 19 wherein the deformable micromechanical structure is comprised of a semiconductor material selected from the group consisting of silicon, gallium arsenide, germanium, silicon-germanium, and silicon carbide.

22. The method of claim 19 wherein the dopant ions are selected from the group consisting of boron, phosphorus, arsenic, antimony, gallium, indium, and aluminum.

23. The method of claim 19 wherein the sidewall is a sidewall of a flexible beam that flexes in a direction parallel with the substrate surface.

24. The method of claim 19 wherein the sidewall is perpendicular to the substrate surface.

25. The method of claim 19 wherein step (b) comprises the step of forming highly doped regions on the sidewall.

* * * * *